United States Patent
Kawasaki et al.

(10) Patent No.: US 10,665,547 B2
(45) Date of Patent: May 26, 2020

(54) SEMICONDUCTOR DEVICE AND METHOD OF MANUFACTURING THEREOF

(71) Applicant: Mitsubishi Electric Corporation, Tokyo (JP)

(72) Inventors: Yuji Kawasaki, Tokyo (JP); Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/413,927

(22) Filed: May 16, 2019

(65) Prior Publication Data

US 2019/0393158 A1     Dec. 26, 2019

(30) Foreign Application Priority Data

Jun. 21, 2018   (JP) .................................. 2018-117583

(51) Int. Cl.
*H01L 23/532* (2006.01)
*H01L 21/768* (2006.01)
*H01L 21/02* (2006.01)

(52) U.S. Cl.
CPC .. *H01L 23/53295* (2013.01); *H01L 21/02282* (2013.01); *H01L 21/76802* (2013.01); *H01L 21/76819* (2013.01)

(58) Field of Classification Search
None
See application file for complete search history.

(56) References Cited

U.S. PATENT DOCUMENTS

| | | | |
|---|---|---|---|
| 6,780,739 B1 * | 8/2004 | Mao | H01L 21/76807 257/382 |
| 7,906,848 B2 * | 3/2011 | Kumagai | H01L 23/3128 257/620 |
| 8,587,119 B2 * | 11/2013 | Hwang | H01L 24/05 257/734 |
| 2014/0160401 A1 * | 6/2014 | Yonemura | G02F 1/134309 349/96 |

FOREIGN PATENT DOCUMENTS

| | | |
|---|---|---|
| JP | H05-021615 A | 1/1993 |
| JP | 2010-040713 A | 2/2010 |

* cited by examiner

*Primary Examiner* — Thien F Tran
(74) *Attorney, Agent, or Firm* — Studebaker & Brackett PC

(57) ABSTRACT

An object of the present invention is to provide a semiconductor device and a method of manufacturing thereof capable of relaxing a level difference thereon. A semiconductor device according to the present invention includes a first interlayer insulating film having a first opening, and a second interlayer insulating film having a second opening wherein a following expression is satisfied: $(H2-H1)/((W2-W1)/2) \leq 3.6$ where, in sectional view, W1 represents a width of the first opening, W2 represents a width of the second opening, H1 represents a minimum value of a height from a surface of the semiconductor substrate to a surface of the third interlayer insulating film in the second opening, and H2 represents a height from the surface of the semiconductor substrate to the surface of the third interlayer insulating film in an end of the second opening.

6 Claims, 6 Drawing Sheets

F I G. 5
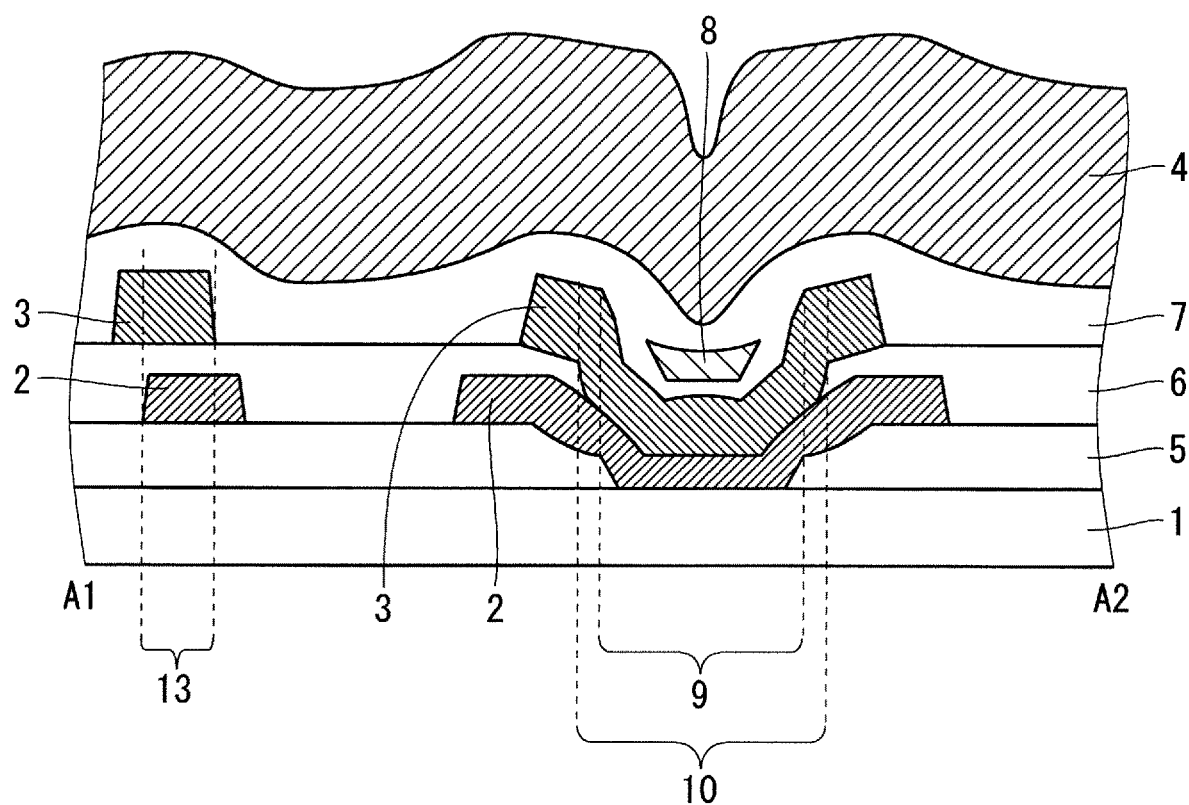

SEMICONDUCTOR DEVICE AND METHOD OF MANUFACTURING THEREOF

BACKGROUND OF THE INVENTION

Field of the Invention

The present invention relates to a semiconductor device and a method of manufacturing thereof, and more particularly to a semiconductor device including a Spin on Glass (SOG) film and a method of manufacturing thereof.

Description of the Background Art

In the manufacturing process of a semiconductor device having a multilayer wiring structure, a method of realizing high integration of a semiconductor device by stacking the contacts connecting the wiring layers appropriately and intensively has been put into practical use (see, Japanese Patent Application Laid-Open No.5-21615).

In the related art, there is a semiconductor device having an SOG film in order to relax a level difference between wirings and a level difference between a wiring and an interlayer insulating film. The SOG film is formed by applying SOG to the center of a wafer while rotating the wafer.

In a case where the SOG film is formed on the semiconductor device of Japanese Patent Application Laid-Open No. 5-21615, the SOG applied to the center of the wafer is spread toward the peripheral portion of the wafer by centrifugal force generated by the rotation of the wafer. However, the large level difference in a region where the wiring layers are stacked suppresses SOG from spreading, and the SOG spreading toward the peripheral portion is hindered from spreading beyond the region. Therefore, even if the SOG film is formed on the semiconductor device of Japanese Patent Application Laid-Open No. 5-21615, the level difference is insufficiently relaxed. When the wiring layer is etched later, the wiring layer to be etched remains unetched due to the level difference, and this is to be a contamination source of the manufacturing line, a factor of a short circuit between wirings, or a factor of defective appearance of a chip.

SUMMARY

An object of the present invention is to provide a semiconductor device and a method of manufacturing thereof capable of relaxing a level difference thereon.

A semiconductor device according to the present invention includes, a semiconductor substrate, a first interlayer insulating film formed on the semiconductor substrate and having a first opening through which the semiconductor substrate is exposed, a first wiring layer formed on the semiconductor substrate within the first opening and extending over the first interlayer insulating film, a second interlayer insulating film formed on a part of the first wiring layer and on the first interlayer insulating film and having a second opening overlapped with the first opening in plan view and through which the first wiring layer is exposed, a second wiring layer formed on the first wiring layer within the second opening and extending over the second interlayer insulating film, a third interlayer insulating film formed on the second wiring layer and the second interlayer insulating film, and a Spin on Glass (SOG) film formed in the third interlayer insulating film and formed so as to overlap with the first opening in plan view, wherein the second opening is larger than the first opening in opening area, and a following expression is satisfied: $(H2-H1)/((W2-W1)/2) \leq 3.6$ where, in sectional view, W1 represents a first opening width which is a width of the first opening, W2 represents a second opening width which is a width of the second opening, H1 represents a minimum value of a height from a surface of the semiconductor substrate to a surface of the third interlayer insulating film in the second opening, and H2 represents a height from the surface of the semiconductor substrate to the surface of the third interlayer insulating film in a second opening end which is an end of the second opening.

A semiconductor device according to the present invention includes, a semiconductor substrate, a first interlayer insulating film formed on the semiconductor substrate and having a first opening through which the semiconductor substrate is exposed, a first wiring layer formed on the semiconductor substrate within the first opening and extending over the first interlayer insulating film, a second interlayer insulating film formed on a part of the first wiring layer and on the first interlayer insulating film and having a second opening overlapped with the first opening in plan view and through which the first wiring layer is exposed, a second wiring layer formed on the first wiring layer within the second opening and extending over the second interlayer insulating film, a third interlayer insulating film formed on the second wiring layer and the second interlayer insulating film, and a Spin on Glass (SOG) film formed in the third interlayer insulating film and formed so as to overlap with the first opening in plan view, wherein the second opening is larger than the first opening in opening area, and a following expression is satisfied: $W2 \leq 1$ μm where, in sectional view, W2 represents a second opening width which is a width of the second opening.

A method of manufacturing a semiconductor device according to the present invention, the method includes the steps of (a) setting a semiconductor substrate, (b) forming a first interlayer insulating film having a first opening through which the semiconductor substrate is exposed on the semiconductor substrate, and (c) forming a first wiring layer on the semiconductor substrate within the first opening and extending over the first interlayer insulating film, (d) forming a second interlayer insulating film covering a part of the first wiring layer and on the first interlayer insulating film and having a second opening overlapped with the first opening in plan view and through which the first wiring layer is exposed, (e) forming a second wiring layer on the first wiring layer within the second opening and extending over the second interlayer insulating film, (f) forming a third interlayer insulating film on the second wiring layer and the second interlayer insulating film, and (g) forming a Spin on Glass (SOG) film in the third interlayer insulating film so as to overlap with the first opening in plan view, wherein the second opening is larger than the first opening in opening area, and a following expression is satisfied: $(H2-H1)/((W2-W1)/2) \leq 3.6$ where, in sectional view, W1 represents a first opening width which is a width of the first opening, W2 represents a second opening width which is a width of the second opening, H1 represents a minimum value of a height from a surface of the semiconductor substrate to a surface of the third interlayer insulating film in the second opening, and H2 represents a height from the surface of the semiconductor substrate to the surface of the third interlayer insulating film in a second opening end which is an end of the second opening.

A method of manufacturing a semiconductor device according to the present invention, the method includes the steps of (a) setting a semiconductor substrate, (b) forming a first interlayer insulating film having a first opening through which the semiconductor substrate is exposed on the semiconductor substrate, and (c) forming a first wiring layer on the semiconductor substrate within the first opening and extending over the first interlayer insulating film, (d) forming a second interlayer insulating film covering a part of the first wiring layer and on the first interlayer insulating film and having a second opening overlapped with the first opening in plan view and through which the first wiring layer is exposed, (e) forming a second wiring layer on the first wiring layer within the second opening and extending over the second interlayer insulating film, (f) forming a third interlayer insulating film on the second wiring layer and the second interlayer insulating film, and (g) forming a Spin on Glass (SOG) film in the third interlayer insulating film so as to overlap with the first opening in plan view, wherein the second opening is larger than the first opening in opening area, and a following expression is satisfied: W2≤1 µm where, in sectional view, W2 represents a second opening width which is a width of the second opening.

A semiconductor device includes, a semiconductor substrate, a first interlayer insulating film formed on the semiconductor substrate and having a first opening through which the semiconductor substrate is exposed, a first wiring layer formed on the semiconductor substrate within the first opening and extending over the first interlayer insulating film, a second interlayer insulating film formed on a part of the first wiring layer and on the first interlayer insulating film and having a second opening overlapped with the first opening in plan view and through which the first wiring layer is exposed, a second wiring layer formed on the first wiring layer within the second opening and extending over the second interlayer insulating film, a third interlayer insulating film formed on the second wiring layer and the second interlayer insulating film, and a Spin on Glass (SOG) film formed in the third interlayer insulating film and formed so as to overlap with the first opening in plan view, wherein the second opening is larger than the first opening in opening area, and a following expression is satisfied: (H2−H1)/((W2−W1)/2)≤3.6 where, in sectional view, W1 represents a first opening width which is a width of the first opening, W2 represents a second opening width which is a width of the second opening, H1 represents a minimum value of a height from a surface of the semiconductor substrate to a surface of the third interlayer insulating film in the second opening, and H2 represents a height from the surface of the semiconductor substrate to the surface of the third interlayer insulating film in a second opening end which is an end of the second opening; therefore, a level difference can be relaxed.

A semiconductor device includes, a semiconductor substrate, a first interlayer insulating film formed on the semiconductor substrate and having a first opening through which the semiconductor substrate is exposed, a first wiring layer formed on the semiconductor substrate within the first opening and extending over the first interlayer insulating film, a second interlayer insulating film formed on a part of the first wiring layer and on the first interlayer insulating film and having a second opening overlapped with the first opening in plan view and through which the first wiring layer is exposed, a second wiring layer formed on the first wiring layer within the second opening and extending over the second interlayer insulating film, a third interlayer insulating film formed on the second wiring layer and the second interlayer insulating film, and a Spin on Glass (SOG) film formed in the third interlayer insulating film and formed so as to overlap with the first opening in plan view, wherein the second opening is larger than the first opening in opening area, and a following expression is satisfied: W2≤1 µm where, in sectional view, W2 represents a second opening width which is a width of the second opening; therefore, a level difference can be relaxed.

A method of manufacturing a semiconductor device includes the steps of (a) setting a semiconductor substrate, (b) forming a first interlayer insulating film having a first opening through which the semiconductor substrate is exposed on the semiconductor substrate, and (c) forming a first wiring layer on the semiconductor substrate within the first opening and extending over the first interlayer insulating film, (d) forming a second interlayer insulating film covering a part of the first wiring layer and on the first interlayer insulating film and having a second opening overlapped with the first opening in plan view and through which the first wiring layer is exposed, (e) forming a second wiring layer on the first wiring layer within the second opening and extending over the second interlayer insulating film, (f) forming a third interlayer insulating film on the second wiring layer and the second interlayer insulating film, and (g) forming a Spin on Glass (SOG) film in the third interlayer insulating film so as to overlap with the first opening in plan view, wherein the second opening is larger than the first opening in opening area, and a following expression is satisfied: (H2−H1)/((W2−W1)/2)≤3.6 where, in sectional view, W1 represents a first opening width which is a width of the first opening, W2 represents a second opening width which is a width of the second opening, H1 represents a minimum value of a height from a surface of the semiconductor substrate to a surface of the third interlayer insulating film in the second opening, and H2 represents a height from the surface of the semiconductor substrate to the surface of the third interlayer insulating film in a second opening end which is an end of the second opening; therefore, a level difference can be relaxed.

A method of manufacturing a semiconductor device includes the steps of (a) setting a semiconductor substrate, (b) forming a first interlayer insulating film having a first opening through which the semiconductor substrate is exposed on the semiconductor substrate, and (c) forming a first wiring layer on the semiconductor substrate within the first opening and extending over the first interlayer insulating film, (d) forming a second interlayer insulating film covering a part of the first wiring layer and on the first interlayer insulating film and having a second opening overlapped with the first opening in plan view and through which the first wiring layer is exposed, (e) forming a second wiring layer on the first wiring layer within the second opening and extending over the second interlayer insulating film, (f) forming a third interlayer insulating film on the second wiring layer and the second interlayer insulating film, and (g) forming a Spin on Glass (SOG) film in the third interlayer insulating film so as to overlap with the first opening in plan view, wherein the second opening is larger than the first opening in opening area, and a following expression is satisfied: W2≤1 µm where, in sectional view, W2 represents a second opening width which is a width of the second opening; therefore, a level difference can be relaxed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a cross-sectional view illustrating an example of a configuration of a semiconductor device according to a premise art;

DESCRIPTION OF THE PREFERRED EMBODIMENTS

Figure 1:
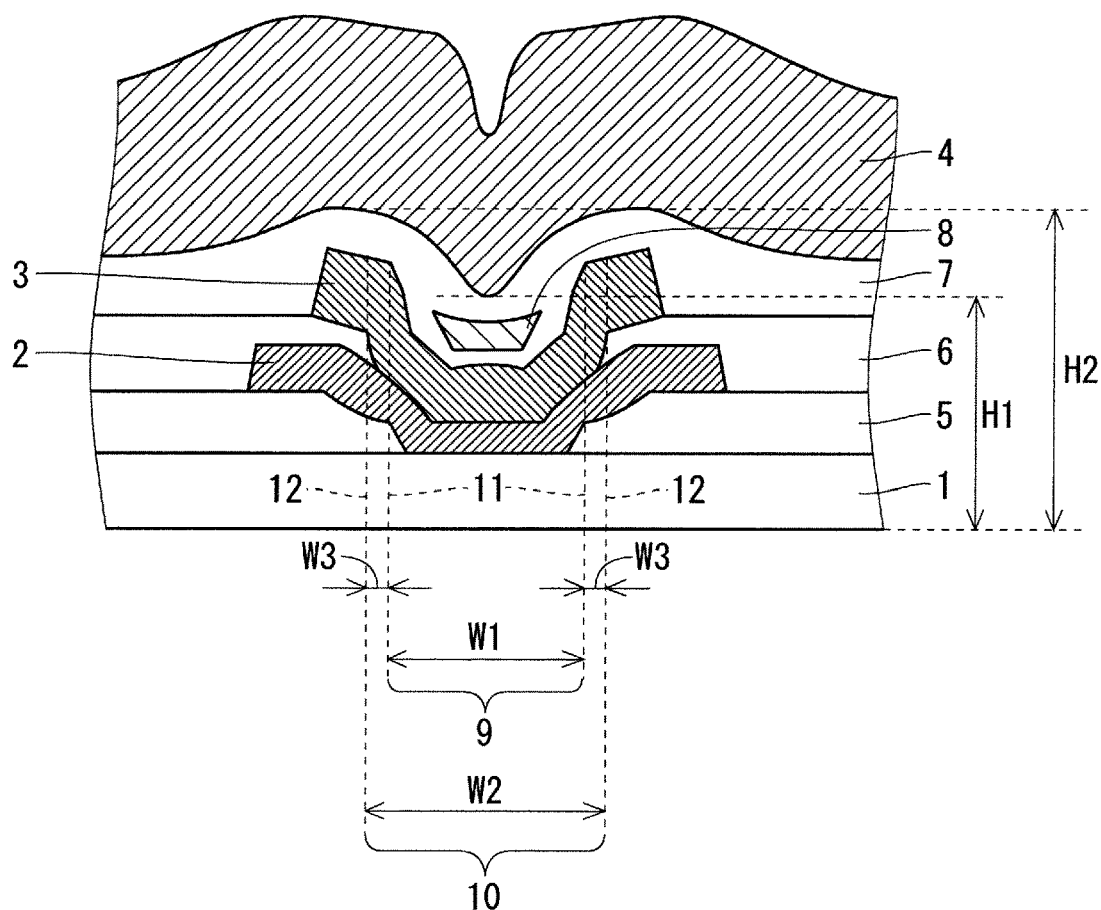
FIG. 1 is a cross-sectional view illustrating an example of a configuration of a semiconductor device of Embodiment 1 according to the present invention.

Hereinafter, Embodiments of the present invention are described with reference to the drawings.

Premise Art

First, the premise art for the present invention will be described.

FIG. 5 is a cross-sectional view illustrating an example of a configuration of a semiconductor device according to the premise art.

A first interlayer insulating film 5 formed on a semiconductor substrate 1 has a first opening 9 through which the semiconductor substrate 1 is exposed. A first wiring layer 2 is formed on the semiconductor substrate 1 within the first opening 9 and extends over the first interlayer insulating film 5. The first wiring layer 2 is also formed on the first interlayer insulating film 5 other than the first opening 9.

A second interlayer insulating film 6 is formed on a part of the first wiring layer 2 and on the first interlayer insulating film 5. The second interlayer insulating film 6 has a second opening 10 which is overlapped with the first opening 9 in plan view and through which the first wiring layer 2 is exposed. The second interlayer insulating film 6 is also formed such that the first wiring layer 2 formed on the insulating film 5 other than the first opening 9 is covered thereby. Here, the second opening 10 is larger than the first opening 9 in opening area.

A second wiring layer 3 is formed on the first wiring layer 2 within the second opening 10 and extends over the second interlayer insulating film 6. The second wiring layer 3 is also formed on the second interlayer insulating film 6 other than the second opening 10. A third interlayer insulating film 7 is formed such that the second wiring layer 3 and the second interlayer insulating film 6 are covered thereby.

An SOG film 8 is formed in the third interlayer insulating film 7 so as to overlap with the first opening 9 in plan view. A third wiring layer 4 is formed on the third interlayer insulating film 7. A region 13 is a region in which the first wiring layer 2 formed on the first interlayer insulating film 5 other than the first opening 9 and the second wiring layer 3 formed on the second interlayer insulating film 6 other than the second opening 10 are overlapped in plan view.

As described above, the SOG film 8 has viscosity. The SOG film 8 is used for primarily relaxing the level difference of the interlayer insulating film formed on the wiring. Alternatively, the SOG film 8 is used for embedding in a groove foamed between the wirings so as to relax the level difference between the wirings. The SOG film 8 is formed by applying the SOG to the center of the wafer while rotating the wafer and then further rotating the wafer to adjust the film thickness of the SOG film 8 so as to make the film thickness uniform within the wafer surface. Specifically, the greater the amount of SOG embedded in the groove formed between the wires is, the more effective it is for relaxing the level difference between the wires.

Figure 6:
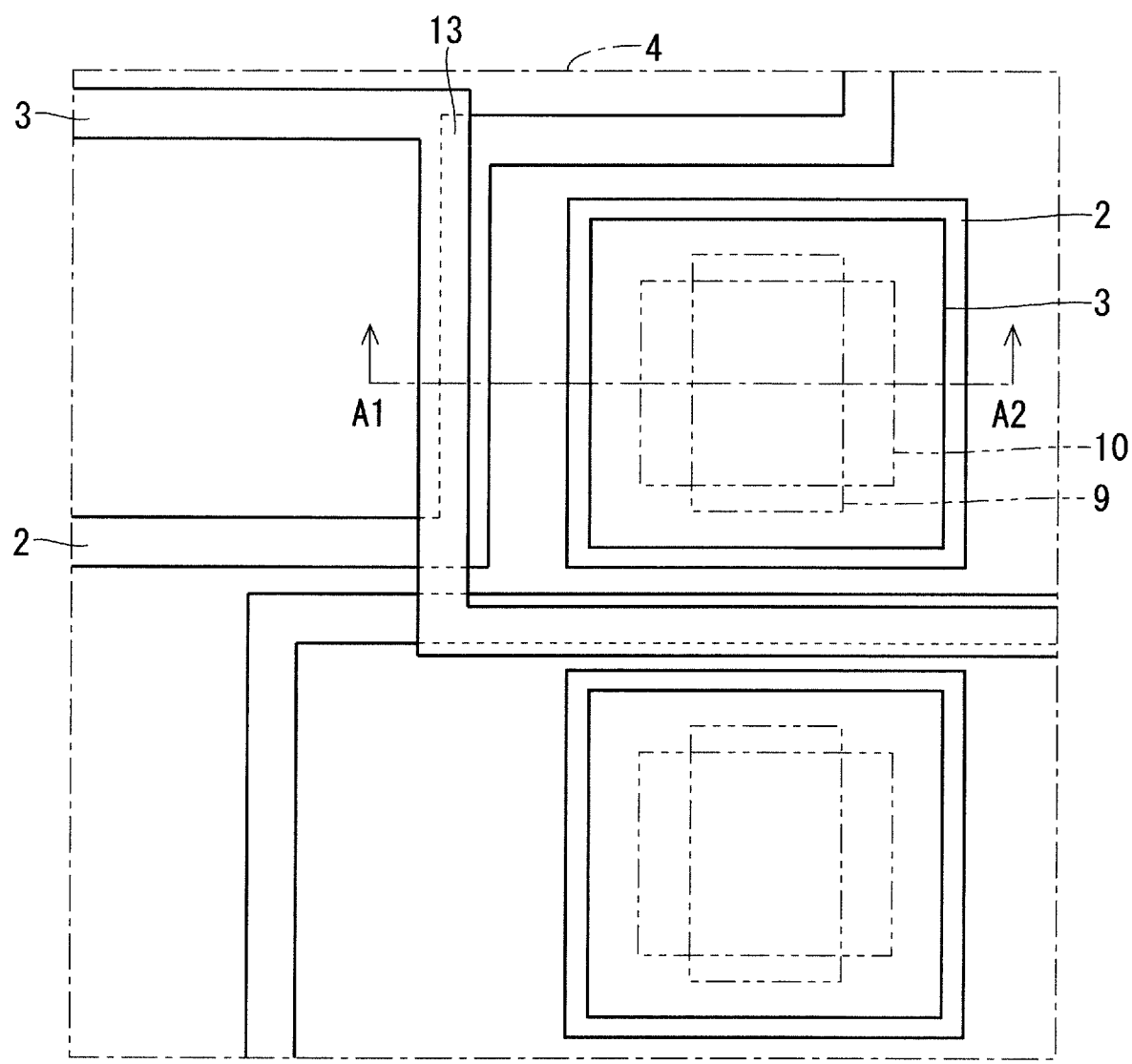
FIG. 6 is a plan view illustrating an example of a configuration of the semiconductor device according to the premise art.

FIG. 6 is a plan view illustrating an example of a configuration of the semiconductor device according to the premise art, and illustrating a layout of the wiring pattern thereof. Note that, the cross-section taken along line A1-A2 in FIG. 6 corresponds to the cross-sectional view of the semiconductor device illustrated in FIG. 5.

In FIG. 6, the level differences are large in the region 13, and the region where the first opening 9 and the second opening 10 overlap each other in a plan view. Here, the region where the first opening 9 and the second opening 10 overlap each other in a plan view is referred to as a stack region.

In the layout of the wiring pattern illustrated in FIG. 6, when the SOG film 8 is formed after the formation of the first wiring layer 2 and the second wiring layer 3, the SOG applied to the center of the wafer is spread toward the peripheral portion of the wafer by the centrifugal force generated by the rotation of the wafer. However, the large level difference in the region 13 suppresses SOG from spreading, and the SOG spreading toward the peripheral portion is hindered from spreading beyond the region 13.

Figure 7:
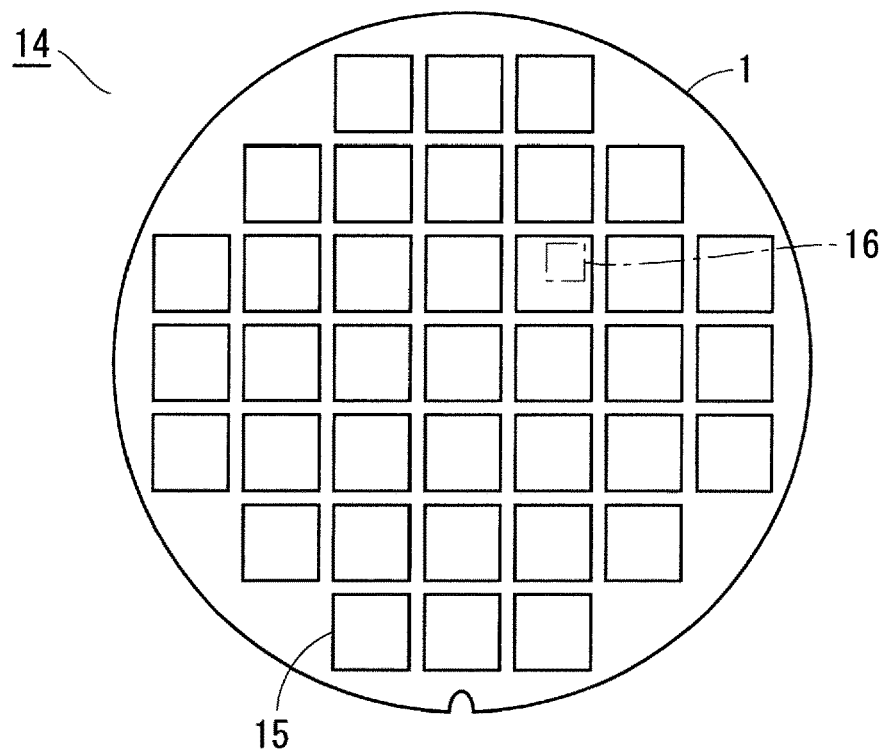
FIG. 7 is a diagram illustrating a silicon wafer.

FIG. 7 is a diagram illustrating a silicon wafer 14. The silicon wafer 14 includes the semiconductor substrate 1 and a plurality of chips 15 are formed on the semiconductor substrate 1.

Figure 8:
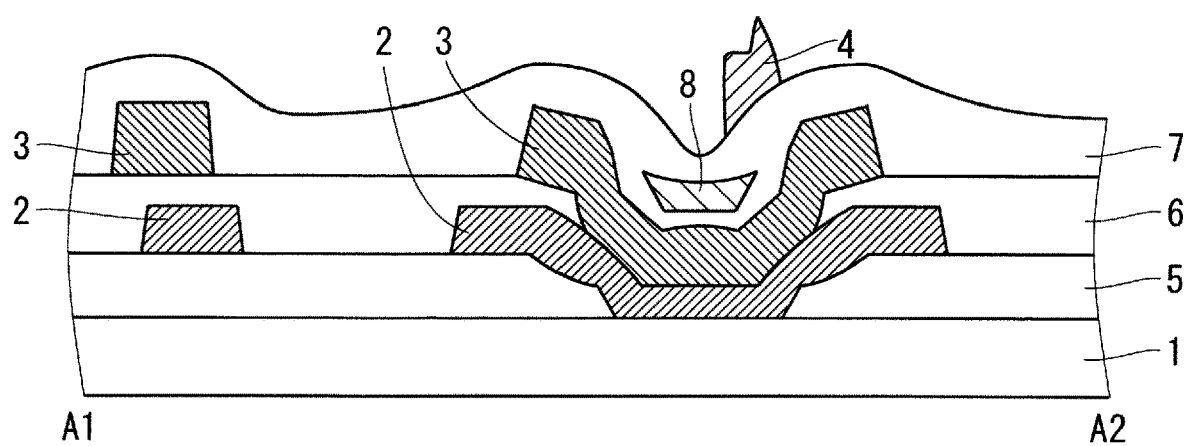
FIG. 8 is a cross-sectional view illustrating an example of a configuration of the semiconductor device according to a premise art.
Figure 9:
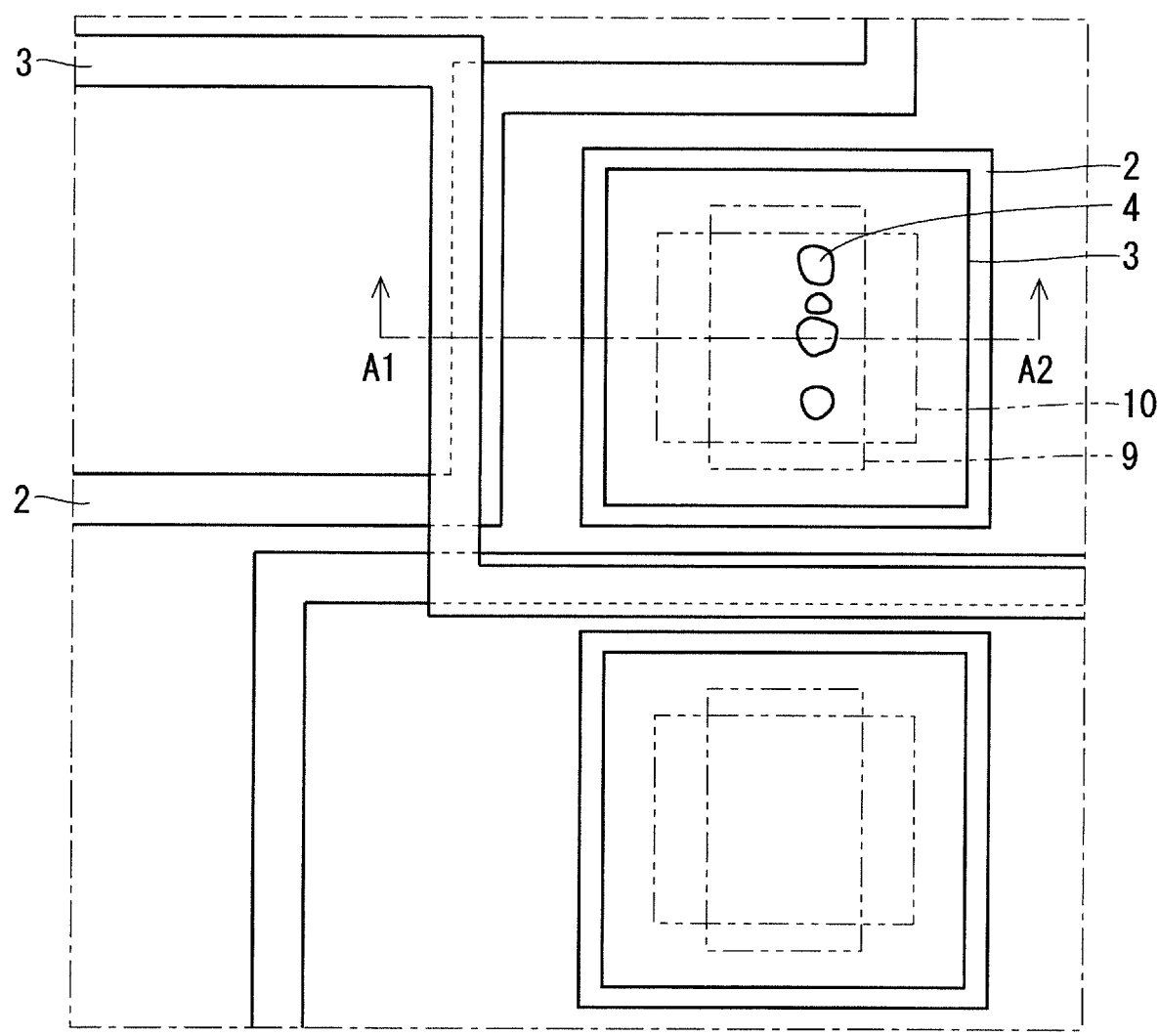
FIG. 9 is a plan view illustrating an example of a configuration of the semiconductor device according to the premise art.

For example, in the case where the wiring pattern illustrated in FIG. 6 is formed in a region 16 in FIG. 7, the region 13 is closer to the center of the silicon wafer 14 than the stack region; therefore, the level difference of the region 13 suppresses the SOG from spreading and the SOG is insufficiently deposited on the stack region. Therefore, the level difference is not sufficiently relaxed by the SOG. When the third wiring layer 4 is formed in this state and then the third wiring layer 4 is etched, as illustrated in FIGS. 8 and 9 corresponding to FIGS. 5 and 6, the reaction product adhering to the side wall of the level difference impedes etching and the third wiring layer 4 remains unetched. The third wiring layer 4 remaining unetched after the etching is problematic because this is to be a contamination source of the manufacturing line, a factor of a short circuit between wirings, or a factor of defective appearance of a chip. Therefore, relaxation of the level defense is crucial for the prevention of such a problem.

Embodiments of the present invention ensure relaxation of the level difference and the description is made in detail below.

Embodiment 1

FIG. 1 is a cross-sectional view illustrating an example of a configuration of a semiconductor device of Embodiment 1 according to the present invention. Note that, the cross-sectional view illustrated in FIG. 1 corresponds to the cross-section taken along line A1-A2 in FIG. 9.

A first interlayer insulating film 5 formed on a semiconductor substrate 1 has a first opening 9 through which the semiconductor substrate 1 is exposed. The width of the first opening 9 in sectional view corresponds to the distance between the first opening ends 11 and is represented by the first opening width W1. A first wiring layer 2 is formed on the semiconductor substrate 1 within the first opening 9 and extends over the first interlayer insulating film 5.

A second interlayer insulating film 6 is formed on a part of the first wiring layer 2 and on the first interlayer insulating film 5. The second interlayer insulating film 6 has a second opening 10 which is overlapped with the first opening 9 and through which the first wiring layer 2 is exposed in plan view. The width of the second opening 10 in sectional view corresponds to the distance between the second opening ends 12 and is represented by the second opening width W2. Here, the second opening 10 is larger than the first opening 9 in opening area. That is, the second opening width W2 is larger than the first opening width W1.

A second wiring layer 3 is formed on the first wiring layer 2 within the second opening 10 and extends over the second interlayer insulating film 6. A third interlayer insulating film 7 is formed such that the second wiring layer 3 and the second interlayer insulating film 6 are covered thereby. An SOG film 8 is formed in the third interlayer insulating film 7 so as to overlap with the first opening 9 in plan view. A third wiring layer 4 is formed on the third interlayer insulating film 7.

In addition, a height H1 indicates the minimum value of the height from the surface of the semiconductor substrate 1 to the surface of the third interlayer insulating film 7 in the second opening 10, that is, the second opening width W2 in sectional view. A height H2 indicates the height from the surface of the semiconductor substrate 1 in the second opening end 12 to the surface of the third interlayer insulating film 7 in the second opening end 12 in sectional view. In the semiconductor device according Embodiment 1, the first opening width W1, the second opening width W2, the height H1, and the height H2 are configured to satisfy the following expression (1).

$$(H2-H1)/((W2-W1)/2 \leq 3.6 \tag{1}$$

The above expression (1) is rephrased as $(H2-H1)/W3 \leq 3.6$. Here, W3 is a gap between the first opening end 11 and the second opening end 12.

Figure 2:
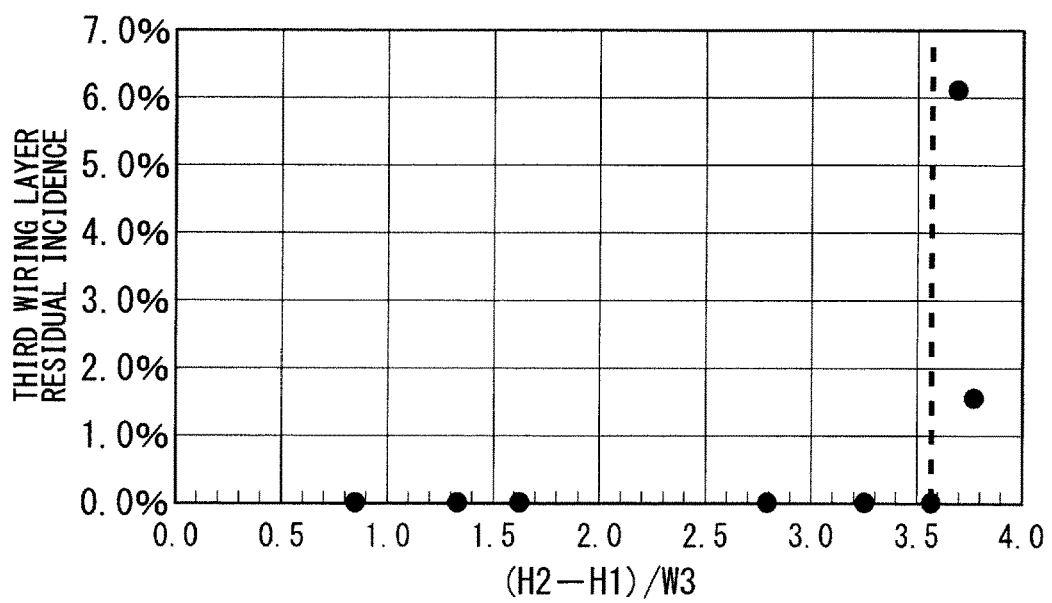
FIG. 2 is a graph illustrating the third wiring layer residual incidence of the semiconductor device of Embodiment 1 according to the present invention.

FIG. 2 is a graph illustrating the third wiring layer residual incidence of the semiconductor device of Embodiment 1 according to the present invention. Specifically, FIG. 2 is experiment data illustrating the third wiring layer residual incidence when the value obtained by (H2-H1)/W3 is varied. The third wiring layer residual incidence indicates the probability that the third wiring layer 4 remains without being etched. A black dot plotted in the graph indicates a third wiring layer incidence which is obtained by drawing four samples for one value obtained with (H2-H1)/W3 and the third wiring layer incidence is obtained from the drawn four samples.

As it can be seen from FIG. 2, when $(H2-H1)/W3 \leq 3.6$, that is, the above expression (1) is satisfied, the third wiring layer 4 does not remain after etching.

As described above, according to Embodiment 1, by forming the semiconductor device so as to satisfy the above expression (1), the width of the third wiring layer 4 formed after the formation of the third interlayer insulating film 7 including the SOG film 8 is widened in sectional view; therefore, the level difference in the stack region is relaxed. Accordingly, when the third wiring layer 4 is etched, adhesion of the reaction product on the side wall of the third interlayer insulating film 7 is suppressed and prevention of the third wiring layer 4 from remaining after etching is ensured. Further, prevention of the remained third wiring layer 4 after etching from being a contamination source of the manufacturing line, a factor of a short circuit between wirings, or a factor of defective appearance of a chip is ensured.

Embodiment 2

Figure 3:
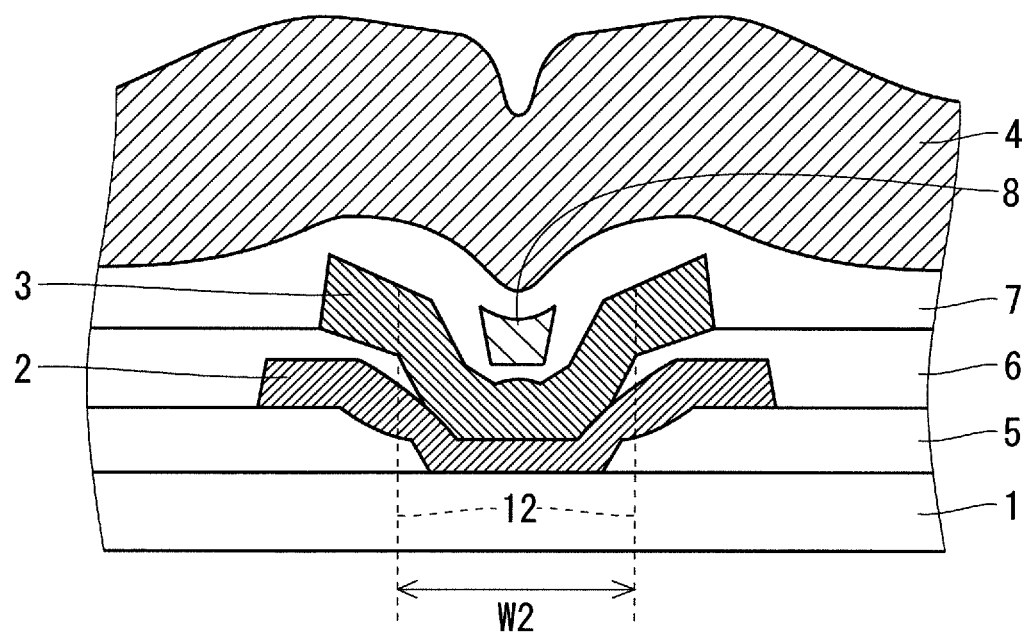
FIG. 3 is a cross-sectional view illustrating an example of a configuration of a semiconductor device of Embodiment 2 according to the present invention.

FIG. 3 is a cross-sectional view illustrating an example of a configuration of a semiconductor device of Embodiment 2 according to the present invention. Note that, the cross-sectional view illustrated in FIG. 3 corresponds to the cross-section taken along line A1-A2 in FIG. 9.

In a semiconductor device according to Embodiment 2, a second opening width W2 is characterized for having 1 µm or less. Specifically, the semiconductor device according Embodiment 2 is configured such that the second opening width W2 satisfies the following expression (2).

$$W2 \leq 1 \text{ µm} \tag{2}$$

The rest of the configuration is the same as that of Embodiment 1, therefore, a detailed description thereof is omitted.

Figure 4:
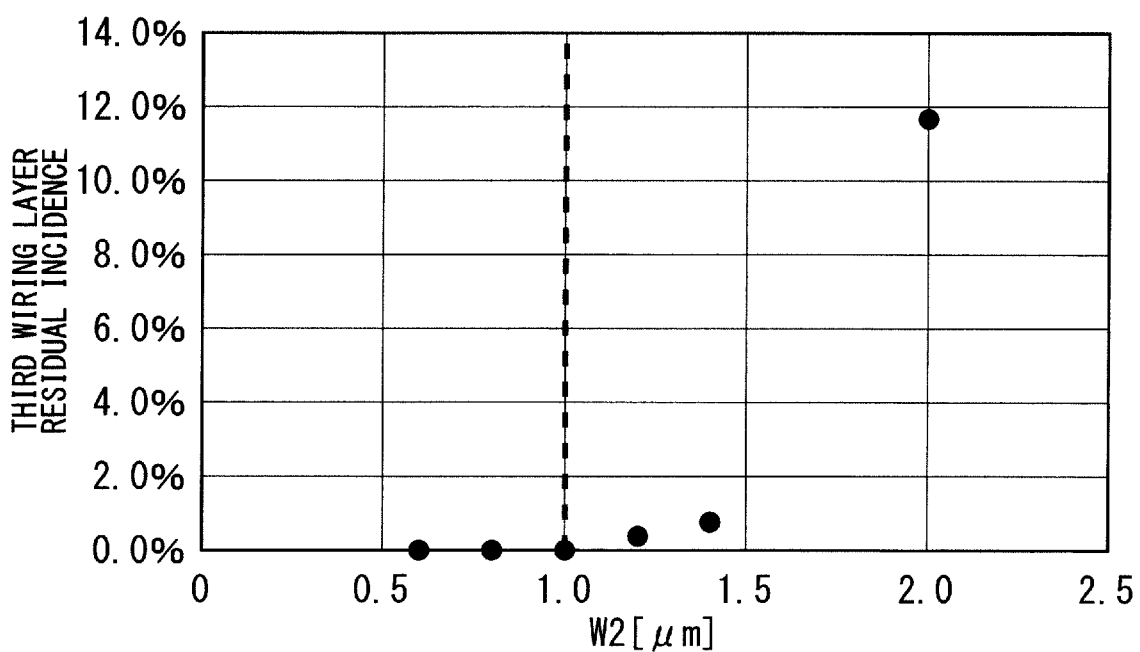
FIG. 4 is a graph illustrating the third wiring layer residual incidence of the semiconductor device of Embodiment 2 according to the present invention.

FIG. 4 is a graph illustrating the third wiring layer residual incidence of the semiconductor device of Embodiment 2. Specifically, FIG. 4 is experiment data illustrating the third wiring layer residual incidence when the value is varied. A black dot plotted in the graph indicates a third wiring layer incidence which is obtained by drawing 120 samples for one value of W2 and the third wiring layer incidence is obtained from the drawn 120 samples.

As it can be seen from FIG. 4, when the second opening width W2 is 1 µm, that is, the above expression (2) is satisfied, the third wiring layer 4 does not remain after etching.

As described above, according to Embodiment 2, the amount of SOG embedded in the stack region is not changed as compared with that of in Embodiment 1, the second opening width W2 is narrower, therefore, the thickness of the SOG film in sectional view is thicker, and thus the level difference in the stack region is relaxed. Accordingly, when the third wiring layer 4 is etched, adhesion of the reaction product on the side wall of the third interlayer insulating film 7 is suppressed and prevention of the third wiring layer 4 from remaining after etching is ensured. Further, prevention of the remained third wiring layer 4 after etching from being a contamination source of the manufacturing line, a factor of a short circuit between wirings, or a factor of defective appearance of a chip is ensured.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor substrate;
   a first interlayer insulating film formed on the semiconductor substrate and having a first opening through which the semiconductor substrate is exposed;
   a first wiring layer formed on the semiconductor substrate within the first opening and extending over the first interlayer insulating film;
   a second interlayer insulating film formed on a part of the first wiring layer and on the first interlayer insulating film and having a second opening overlapped with the first opening in plan view and through which the first wiring layer is exposed;
   a second wiring layer formed on the first wiring layer within the second opening and extending over the second interlayer insulating film;
   a third interlayer insulating film formed on the second wiring layer and the second interlayer insulating film; and
   a Spin on Glass (SOG) film formed in the third interlayer insulating film and formed so as to overlap with the first opening in plan view,
   the second opening being larger than the first opening in opening area,
   a following expression being satisfied $$(H2-H1)/((W2-W1)/2) \leq 3.6$$

where, in sectional view, W1 represents a first opening width which is a width of the first opening, W2 represents a second opening width which is a width of the second opening, H1 represents a minimum value of a height from a surface of the semiconductor substrate to a surface of the third interlayer insulating film in the second opening, and H2 represents a height from the surface of the semiconductor substrate to the surface of the third interlayer insulating film in a second opening end which is an end of the second opening.

2. A semiconductor device, comprising:
   a semiconductor substrate;
   a first interlayer insulating film formed on the semiconductor substrate and having a first opening through which the semiconductor substrate is exposed;
   a first wiring layer formed on the semiconductor substrate within the first opening and extending over the first interlayer insulating film;
   a second interlayer insulating film formed on a part of the first wiring layer and on the first interlayer insulating film and having a second opening overlapped with the first opening in plan view and through which the first wiring layer is exposed;
   a second wiring layer formed on the first wiring layer within the second opening and extending over the second interlayer insulating film;
   a third interlayer insulating film formed on the second wiring layer and the second interlayer insulating film; and
   a Spin on Glass (SOG) film formed in the third interlayer insulating film and formed so as to overlap with the first opening in plan view,
   the second opening being larger than the first opening in opening area,
   a following expression being satisfied $$W2 \leq 1\ \mu m$$

where, in sectional view, W2 represents a second opening width which is a width of the second opening.

3. A method of manufacturing a semiconductor device, comprising the steps of:
   (a) setting a semiconductor substrate;
   (b) forming a first interlayer insulating film having a first opening through which the semiconductor substrate is exposed on the semiconductor substrate; and
   (c) forming a first wiring layer on the semiconductor substrate within the first opening and extending over the first interlayer insulating film;
   (d) forming a second interlayer insulating film covering a part of the first wiring layer and on the first interlayer insulating film and having a second opening overlapped with the first opening in plan view and through which the first wiring layer is exposed;
   (e) forming a second wiring layer on the first wiring layer within the second opening and extending over the second interlayer insulating film;
   (f) forming a third interlayer insulating film on the second wiring layer and the second interlayer insulating film; and
   (g) forming a Spin on Glass (SOG) film in the third interlayer insulating film so as to overlap with the first opening in plan view,
   the second opening being larger than the first opening in opening area,
   a following expression being satisfied $$(H2-H1)/((W2-W1)/2) \leq 3.6$$

where, in sectional view, W1 represents a first opening width which is a width of the first opening, W2 represents a second opening width which is a width of the second opening, H1 represents a minimum value of a height from a surface of the semiconductor substrate to a surface of the third interlayer insulating film in the second opening, and H2 represents a height from the surface of the semiconductor substrate to the surface of the third interlayer insulating film in a second opening end which is an end of the second opening.

4. A method of manufacturing a semiconductor device, comprising the steps of:
   (a) setting a semiconductor substrate;
   (b) forming a first interlayer insulating film having a first opening through which the semiconductor substrate is exposed on the semiconductor substrate; and
   (c) forming a first wiring layer on the semiconductor substrate within the first opening and extending over the first interlayer insulating film;
   (d) forming a second interlayer insulating film covering a part of the first wiring layer and on the first interlayer insulating film and having a second opening overlapped with the first opening in plan view and through which the first wiring layer is exposed;
   (e) forming a second wiring layer on the first wiring layer within the second opening and extending over the second interlayer insulating film;
   (f) forming a third interlayer insulating film on the second wiring layer and the second interlayer insulating film; and
   (g) forming a Spin on Glass (SOG) film in the third interlayer insulating film so as to overlap with the first opening in plan view,
   the second opening being larger than the first opening in opening area,
   a following expression being satisfied $$W2 \leq 1\ \mu m$$

where, in sectional view, W2 represents a second opening width which is a width of the second opening.

5. The method of manufacturing a semiconductor device according to claim 3, further comprising the steps of:
   (h) forming a third wiring layer on the third interlayer insulating film; and
   (i) etching the third wiring layer.

6. The method of manufacturing a semiconductor device according to claim 4, further comprising the steps of:
   (h) forming a third wiring layer on the third interlayer insulating film; and
   (i) etching the third wiring layer.

\* \* \* \* \*